(12) United States Patent
Shibayama

(10) Patent No.: US 7,290,234 B2
(45) Date of Patent: Oct. 30, 2007

(54) METHOD FOR COMPUTER AIDED DESIGN OF SEMICONDUCTOR INTEGRATED CIRCUITS

(75) Inventor: Akinori Shibayama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/122,221

(22) Filed: May 5, 2005

(65) Prior Publication Data

US 2006/0288321 A1    Dec. 21, 2006

(30) Foreign Application Priority Data

May 11, 2004   (JP) ............................. 2004-140864

(51) Int. Cl.
  *G06F 17/50*    (2006.01)
(52) U.S. Cl. ............................. 716/11; 716/2; 716/12
(58) Field of Classification Search .................. 716/1, 716/2, 6, 10, 11, 12
  See application file for complete search history.

(56) References Cited

U.S. PATENT DOCUMENTS 6,362,506 B1 *  3/2002  Miyai .......................... 257/330
7,032,194 B1 *  4/2006  Hsueh et al. ................... 716/4
7,155,689 B2 * 12/2006  Pierrat et al. .................. 716/4

FOREIGN PATENT DOCUMENTS

JP    2001-351985    12/2001

* cited by examiner

*Primary Examiner*—Thuan Do
(74) *Attorney, Agent, or Firm*—McDermott Will & Emery LLP

(57) ABSTRACT

In transistor layout design, a plurality of distances Lfig1, Lfig2, Lfig3 from a gate electrode of a transistor to the edge of a diffusion layer are displayed by multiple lines according to a variation amount of a transistor characteristic with the use of a CAD tool. A layer for defining an isolation region between adjacent transistors is extended automatically by the CAD tool. Accordingly, even in the case where the transistor characteristic varies depending on the distance from the gate electrode of the transistor to the edge of the diffusion layer, the isolation region between the adjacent transistors can be layouted and designed optimally with no measurement of the distance by designer's visual observation necessitated.

13 Claims, 5 Drawing Sheets

METHOD FOR COMPUTER AIDED DESIGN OF SEMICONDUCTOR INTEGRATED CIRCUITS

CROSS REFERENCE TO RELATED APPLICATIONS

This Non-provisional application claims priority under 35 U.S.C. § 119(a) on Patent Application No. 2004-140864 filed in Japan on May 11, 2004, the entire contents of which are hereby incorporated by reference.

BACKGROUND ART

The present invention relates to a method for computer aided design of layout design of a semiconductor integrated circuit.

Conventionally, semiconductor integrated circuits composed by integrating a plurality of transistor and wirings on a semiconductor substrate are designed using a CAD tool, as disclosed in Japanese Patent Application Laid Open Publication No. 2001-351985A, for example.

Recently, in association with miniaturization of semiconductor elements, a problem rises that transistor characteristics vary depending on a distance from a gate electrode of a transistor to an edge of a diffusion layer. In a P-channel MOS transistor having a long distance from the gate electrode of the transistor to the edge of the diffusion layer, an electric current decreases compared with other P-channel MOS transistors having the same gate width. On the other hand, in a N-channel MOS transistor having a short distance from the gate electrode of the transistor to the edge of the diffusion layer, an electric current decreases compared with other N-channel MOS transistors having the same gate width. Under the circumstances, if peripheral circuits, which are the same circuits to be layouted repeatedly depending on layout intervals of memory cells, are different from each other in the distance from the gate electrode of the transistor to the edge of the diffusion layer, circuit characteristics differ due to difference in the transistor characteristics of the peripheral circuits, resulting in invitation to inhibition of stable circuit operation.

The distance from the gate electrode of the transistor to the edge of the diffusion layer can be used as an index of a variation amount of a transistor characteristic in layout design. Conventional layout design systems for semiconductor integrated circuits, however, neither indicates the distance from the gate electrode of the transistor to the edge of the diffusion layer nor automatically generates a layout in which a variation amount of a transistor characteristic decreases. Under the circumstances, it is necessary for designers to set the distance from the gate electrode of the transistor to the edge of the diffusion layer by visual observation while taking account of a variation amount of an electric current as a transistor characteristic. This layout work is, however, not so easy and a desired layout cannot be obtained in some cases, reducing a design efficiency.

Further, variation amounts of transistor characteristics may differ depending on a manufacturing process, inviting design with erroneous distance set by a layout designer.

SUMMARY OF THE INVENTION

The present invention has its object of providing a computer aided design method capable of optimally setting a range of an isolation region between adjacent transistors so that the problems that variation of a transistor characteristic, which is caused depending on the distance from a gate electrode of a transistor to the edge of a diffusion layer, degrades performance and inhibits stable operation of a semiconductor integrated circuit.

To attain the above object, in the present invention, an index for optimally setting a layer for defining an isolation region between adjacent transistors (in other words: a layer for defining a diffusion layer) is indicated according to a variation amount of a transistor characteristic in layout design of multiple transistors, and the isolation region in a such optimum index range are generated by a CAD tool automatically.

Specifically, in the present invention, a method for computer aided design of a semiconductor integrated circuit for designing, using a CAD tool, a semiconductor integrated circuit composed by integrating a plurality of transistors and wirings on a semiconductor substrate, includes the step of: displaying, in layout for generating a layer for defining an isolation region between adjacent transistors among the transistors and layers for defining gate electrodes of the transistors, a plurality of layer candidates for the layer for defining the isolation region between the adjacent transistors, wherein the plurality of layer candidates for the layer for defining the isolation region are different from each other in distance from the gate electrode to an end of the own layer candidate.

In the method for computer aided design of a semiconductor integrated circuit of the present invention, in the step of displaying the plurality of layer candidates, one layer for defining the isolation region between the adjacent transistors is displayed while at least one line specifying an end of the isolation region is displayed in parallel with an end of the layer for defining the isolation region, and the end of the layer for defining the isolation region and the line are different from each other in distance from the gate electrode.

In the method for computer aided design of a semiconductor integrated circuit of the present invention, in the step of displaying the plurality of layer candidates, one layer for defining an isolation region between an own transistor and an adjacent transistor is displayed while a plurality of colored lines are displayed in parallel with an end of the layer for defining the isolation according to a characteristic of the own transistor, and the end of the layer for defining the isolation region and boundaries as the plurality of colored lines are different from each other in distance from the gate electrode.

In the method for computer aided design of a semiconductor integrated circuit of the present invention, in the step of displaying the plurality of layer candidates, one layer for defining an isolation region between an own transistor and an upper or lower adjacent transistor is displayed while a line is displayed with a predetermined distance apart from an end in a direction intersected at a right angle with the gate electrode, out of upper, lower, right, and left ends of the layer for defining the isolation region, in parallel with the upper or lower end of the layer for defining the isolation according to a characteristic of the own transistor, and the line specifies an end of an isolation region of the adjacent transistor.

In the method for computer aided design of a semiconductor integrated circuit of the present invention, in the line display, a plurality of lines different in distance from the end of the layer for defining the insulation region in the direction intersected at the right angle with the layer for defining the gate electrode are displayed according to a characteristic of the own transistor.

Another method for computer aided design of a semiconductor integrated circuit for designing, using a CAD tool, a semiconductor integrated circuit composed by integrating a plurality of transistors and wirings on a semiconductor substrate, includes the step of: in layout for generating a layer for defining an isolation region between an own transistor and an adjacent transistor and a layer for defining a gate electrode of the own transistor, generating the layer for defining the isolation region between the own transistor and the adjacent transistor; and extending the generated layer for defining the isolation region according to a characteristic of the own transistor in a direction that a distance from the gate electrode to an end of the isolation region extends.

The method for computer aided design of a semiconductor integrated circuit of the present invention, further includes the step of: generating a layer for defining a dummy gate electrode on an extended portion of the generated layer for defining the isolation region which is to be a diffusion layer region.

In the method for computer aided design of a semiconductor integrated circuit of the present invention, the transistor of which layer for defining the isolation region is to be extended is an N-channel MOS transistor while a layer for defining an isolation region of a P-channel MOS transistor is not extended.

In the method for computer aided design of a semiconductor integrated circuit of the present invention, in the step of extending the generated layer for defining the isolation region, the generated layer for defining the isolation region is extended according to a characteristic of the adjacent transistor so as to remove an isolation region intervening between the own transistor and the adjacent transistor.

In the method for computer aided design of a semiconductor integrated circuit of the present invention, the step of extending the generated layer for defining the isolation region is executed at a time when original layout data is changed to target layout data by changing a design rule.

The method for computer aided design of a semiconductor integrated circuit of the present invention, further includes the step of: generating a layer for defining a dummy gate electrode on an extended portion of the generated layer for defining the isolation region which is to be a diffusion layer section.

In the method for computer aided design of a semiconductor integrated circuit of the present invention, the transistor of which layer for defining the isolation region is to be extended is an N-channel MOS transistor while a layer for defining an isolation region of a P-channel MOS transistor is not extended.

A still another method for computer aided design of a semiconductor integrated circuit for designing, using a CAD tool, a semiconductor integrated circuit composed by integrating a plurality of transistors and wirings on a semiconductor substrate, includes the step of: in changing original layout data to target layout data by changing a design rule, generating a layer for defining an isolation region between an own transistor and an adjacent transistor; and extending the generated layer for defining the isolation region according to a characteristic of the adjacent transistor so as to remove the isolation region intervening between the own transistor and the adjacent transistors.

As described above, in the present invention, in generating the layer for defining the isolation region between the adjacent transistors, indexes for optimally designing the range of the layer for defining the isolation region are indicated and a layer is generated in such the optimum range by the CAD tool automatically, so that the distance from the gate electrode of the transistor to the edge of the diffusion layer (end of the isolation region defining layer) becomes optimum, thereby obtaining a desired transistor characteristic (desired amount of an electric current) and ensuring stable operation of the designed semiconductor integrated circuit excellently.

BRIEF DESCRIPTION OF THE DRAWINGS

FIG. 4 shows a method for computer aided design of a semiconductor integrated circuit according to Embodiment 4 of the present invention, wherein

FIG. 5 shows a method for computer aided design of a semiconductor integrated circuit according to Embodiment 5, wherein

DETAILED DESCRIPTION OF PREFERRED EMBODIMENTS

Preferred embodiments of the present invention will be described below with reference to the accompanying drawings.

Embodiment 1

Figure 1:
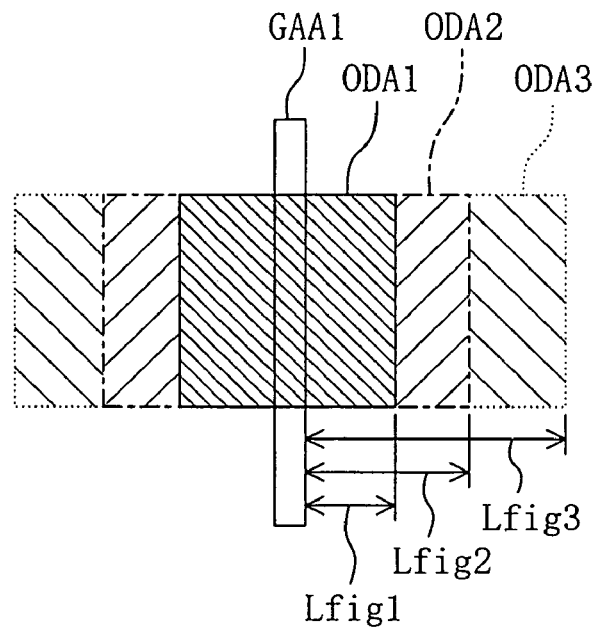
FIG. 1 is a diagram showing a display of computer aided design in transistor layout generation in a method for computer aided design of a semiconductor integrated circuit according to Embodiment 1 of the present invention.

FIG. 1 is a diagram showing transistor layout generation in a method for computer aided design of a semiconductor integrated circuit in Embodiment 1 of the present invention.

A schematic constitution of the method for computer aided design of a semiconductor integrated circuit in Embodiment 1 will be described first with reference to FIG. 1. The description of the method for computer aided design of a semiconductor integrated circuit in the present embodiment will be made by referring to layout design of a MOS transistor using a CAD tool. The same is applied to Embodiment 2 and the following embodiments.

As shown in FIG. 1, elements of a MOS transistor to be layouted are generally: a layer ODA1 for defining an isolation region between adjacent transistors; and a layer GAA1 for defining a gate electrode. A region other than the layer ODA1 for defining the isolation region is to be an isolation region of a shallow trench isolation (STI). Further, an overlap region between the layer ODA1 for defining the isolation region and the layer GAAI for defining the gate electrode is to be a gate electrode portion, and a region of the layer ODA1 for defining the isolation region except the layer GAA1 for defining the gate electrode is to be a region to which ion is implanted.

In general, an electric current value as a MOS transistor characteristic depends on the gate width W and the gate length L of the MOS transistor. However, in association with promoted miniaturization in recent years, stress is caused at formation of the shallow trench isolation (STI), with a result that the electric current value of the MOS transistor depends on a distance from the gate electrode to the isolation region. In this connection, if the distance from the gate electrode to the isolation region is different between MOS transistors having the same gate width and the same gate length, the electric current value may differ to invite unstable circuit operation and invite to obtain characteristics that are not contemplated at circuit design.

Herein, layout design of a MOS transistor composing a semiconductor integrated circuit is performed with the use of a semiconductor integrated circuit design system called a layout editor. Layout data is generated by inputting to the layout editor patterns of a layer for defining an isolation region, a layer for defining a gate electrode, a layer for defining a wiring layer, and the like.

As described, however, a conventional semiconductor layout design system cannot indicate the distance from the gate electrode of the transistor to the edge of the diffusion layer, which serves as an index of a variation amount of a transistor characteristic, in layout design, and cannot automatically generate a layout in which the variation amount of the transistor characteristic decreases. Under the circumstances, it has been necessary conventionally for designers to set the distance from the gate electrode of the transistor to the edge of the diffusion layer by visual observation while taking account of the variation amount of the transistor characteristic. This layout work is, however, not so easy and a desired layout cannot be obtained in some cases, reducing a design efficiency. Further, variation amounts of transistor characteristics may differ depending on a manufacturing process, inviting design with erroneous distance set by a layout designer.

Taking it into consideration, indexes are displayed on the layout editor, as shown in FIG. 1, to solve the above problems. The display will be described below.

As shown in FIG. 1, distances Lfig1, Lfig2, Lfig3 from the gate electrode in the layer GAA1 for defining the gate electrode to the end of the isolation region are called finger lengths. A value of an electric current as a characteristic of a MOS transistor varies depending on the finger length. In general, when the finger length is short, the electric current decreases in an N-channel MOS transistor. Accordingly, the finger length is desirable to be long in a layout for suppressing the current decrease in the MOS transistor to some degree. In this connection, in designing using the layout editor, as shown in FIG. 1, the layout editor displays a plurality of layers, namely, three isolation region defining layers ODA1, ODA2, ODA3 as candidates for the layer for defining the isolation region of the MOS transistor, wherein the candidates have different finger lengths automatically. Herein, the isolation region defining layer ODA1 is a pattern defining an isolation region having a minimum finger length Lfig1 tolerable to its manufacturing process, for example. Another isolation region defining layer ODA2 is displayed by automatically calculating a distance that allows the current decrease amount of the MOS transistor to be a given reference value. Further, the other isolation region defining layer ODA3 is displayed by automatically calculating a distance that allows the current decrease amount of the MOS transistor to be a given reference value smaller than that of the isolation ODA2.

Thereafter, a designer determines and selects a pattern to be used as the isolation region defining layer on the layout editor, thereby determining one layer for defining the isolation region.

Employment of the above design flow attains easy layout as desired without measuring the distance from the gate electrode of the transistor to the edge of the diffusion layer by designer's visual observation. Hence, degradation of the circuit characteristics caused due to erroneous layout design is not invited and time required for layout design is shortened, resulting in remarkable reduction of cost required for design.

It is noted that the case where the three layers are displayed as candidates for the layer for defining the isolation region has been described herein. However, when multi-phase pattern display such as graduation display in which the finger length varies from Lfig1 to Lfig3 is employed in layer display, recognition in further multiple phases is enabled, resulting in further optimum transistor characteristics and layout matching.

Embodiment 2

Figure 2:
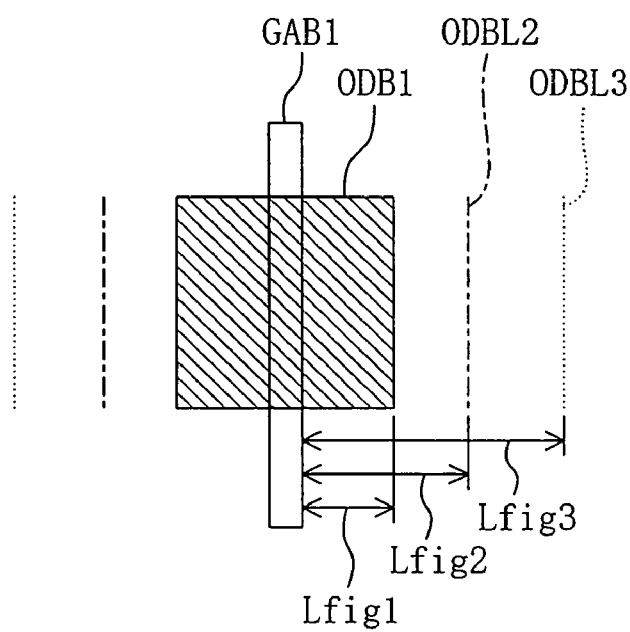
FIG. 2 is a diagram showing a display of computer aided design in transistor layout generation in a method for computer aided design of a semiconductor integrated circuit according to Embodiment 2 of the present invention.

FIG. 2 is a diagram showing transistor layout generation in a method for computer aided design of a semiconductor integrated circuit in Embodiment 2 of the present invention.

A schematic constitution of the method for computer aided design of a semiconductor integrated circuit in Embodiment 2 will be described first with reference to FIG. 2.

In the method for computer aided design of a semiconductor integrated circuit in Embodiment 2, elements of a MOS transistor to be layouted are, as shown in the drawing, a layer ODB1 for defining an isolation region and a layer GAB1 for defining a gate electrode.

As shown in the drawing, distances Lfig1, Lfig2, Lfig3 from the gate electrode in the layer GAB1 for defining the gate electrode to the end of the isolation region are the finger lengths. As described above, a value of an electric current as a characteristic of a MOS transistor varies depending on the finger length. Accordingly, the finger length is desirable to be long in a layout. In this connection, in designing using the layout editor, the layer for defining the isolation region of the MOS transistor is displayed, as shown in FIG. 2, in such fashion that one layer ODB1 for defining the isolation region is displayed as a pattern defining the isolation region having a minimum length Lfig1 tolerable to its manufacturing process.

Further, according to the transistor characteristic, a plurality (2 in FIG. 2) of paired lines ODBL2, ODBL3 each serving as an index of the finger length are displayed automatically as given references. These lines indicate respective candidates for the end of the isolation region, wherein the paired lines ODBL2 are displayed by automatically calculating a distance that allows the current decrease amount of the MOS transistor to be a given reference value, for example, and the other paired lines ODBL3 are displayed by automatically calculating a distance that allows the current decrease amount of the MOS transistor to be a given reference value smaller than that of the paired lines ODBL2.

Next, similar to Embodiment 1, a designer determines and selects to-be used paired lines as the end of the isolation defining layer on the layout editor, thereby determining one layer for defining the isolation region.

Employment of the above design flow enables attains layout as desired without measuring the distance from the gate electrode of the transistor to the edge of the diffusion layer by designer's visual observation. Hence, degradation of the circuit characteristics caused due to erroneous layout design is not invited and time required for layout design is shortened, resulting in remarkable reduction of cost required for design.

It is noted that the two paired lines ODBL2, ODBL3 are displayed merely in the present embodiment but these lines may be colored to be different colors as color-coded boundaries.

Embodiment 3

Figure 3:
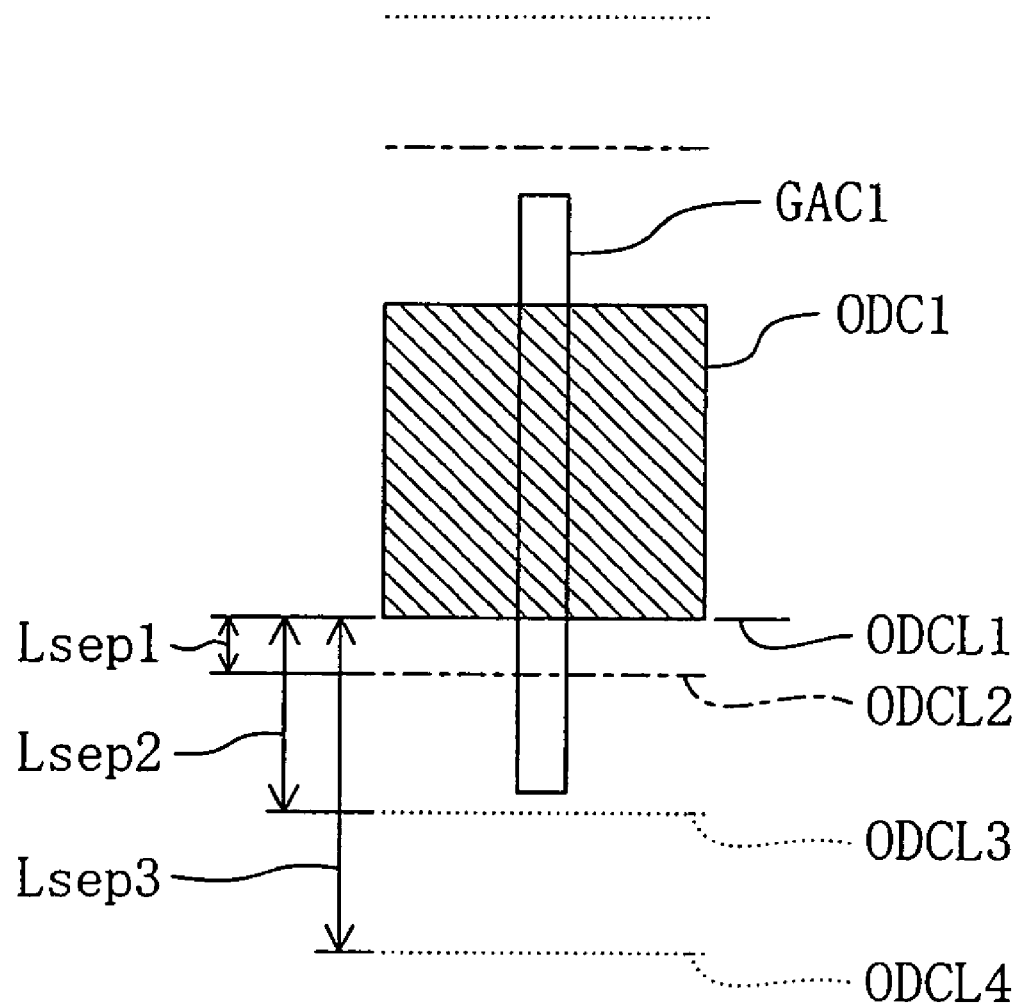
FIG. 3 is diagram showing a display of computer aided design in transistor layout generation in a method for computer aided design of a semiconductor integrated circuit according to Embodiment 3 of the present invention.

FIG. 3 is a diagram showing transistor layout generation in a method for computer aided design of a semiconductor integrated circuit in Embodiment 3 of the present invention.

A schematic constitution of the method for computer aided design of a semiconductor integrated circuit in Embodiment 3 will be described first with reference to FIG. 3.

In the method for computer aided design of a semiconductor integrated circuit according to Embodiment 3, elements to be layouted of a MOS transistor are, as shown in FIG. 3, a layer ODC1 for defining an isolation region, and a layer GAC1 for defining a gate electrode. As shown in FIG. 3, an overlap region between the layer GAC1 for defining the gate electrode and a region where ion implantation is to be performed within the layer ODC1 for defining the isolation region corresponds to the gate electrode.

As shown in the drawing, a distance from the lower end ODCL1 intersected at a right angle with the gate electrode, out of the upper, lower, right, and left ends of the layer ODC1 for defining the isolation region, to an opposite end of an isolation region of another adjacent transistor (not shown) is called an opposite isolation region length, wherein a plurality of candidates Lsep1, Lsep2, Lsep3 for the opposite isolation region length are set so as to correspond to a matter that a plurality of opposite ends of the isolation region of the adjacent transistor are set.

An electric current as a characteristic of MOS transistors varies depending on not only the aforementioned finger length but also the opposite isolation region length. In general, when the opposite isolation region length is short, the electric current decreases in an N-channel MOS transistor. Accordingly, the opposite isolation region length is desirable to be long in a layout for suppressing the current decrease in the MOS transistor to some degree. The transistor characteristic varies depending on the opposite isolation region lengths Lsep1, Lsep2, Lsep3, shown in FIG. 3, which are the distances from the end of the isolation region intersected at a right angle with the gate electrode to the opposite end of the isolation region. Therefore, a layout is desirable in which the opposite isolation region lengths Lsep1, Lsep2, Lsep3 is long.

Taking it into consideration, in designing using the layout editor, the layer ODC1 for defining the isolation region of the MOS transistors is displayed, as shown in FIG. 3, while a line ODCL2 for defining the isolation region having the minimum length Lsep1 tolerable to its manufacturing process is also displayed. Further, a line ODCL3 serving as an index of the opposite isolation region length is displayed automatically as a given reference. This line ODCL3 is displayed by calculating a distance that allows the current decrease amount of the MOS transistor to be a given reference value. Another line ODCL4 is also displayed at a position apart from the layer ODCL1 for defining the isolation region intersected at the right angle with the gate electrode further than the line ODCL3. This line ODCL4 is displayed by automatically calculating a distance that allows the current decrease amount of the MOS transistor to be a given reference value smaller than that of the line ODCL3.

Then, similar to Embodiment 1, a designer determines and selects a line along which the adjacent transistor is to be arranged to layout an adjacent layer for defining the isolation region.

Employment of the above design flow attains easy layout as desired without measuring the opposite isolation region length from the end of the isolation intersected at the right angle with the gate electrode to the opposite end of the isolation region by designer's visual observation. Hence, degradation of the circuit characteristics caused due to erroneous layout design is not invited and time required for layout design is shortened, resulting in remarkable reduction of cost required for design.

Embodiment 4

FIG. 4 shows transistor layout generation in a method for computer aided design of a semiconductor integrated circuit in Embodiment 4 of the present invention.

Figure 4A:
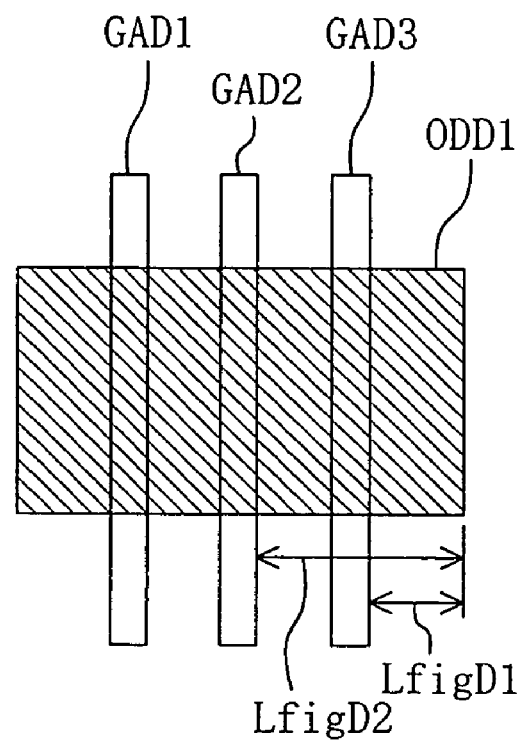
FIG. 4A is a layout diagram showing an isolation region before extension in transistor layout generation and FIG. 4B is a layout diagram showing the isolation region after extension therein.

As shown in FIG. 4A, a layout of three MOS transistors that use a source or a drain in common includes elements of: a layer ODD1 for defining an isolation region; and layers GAD1, GAD2, GAD3 each for defining a gate electrode. Wherein, a region other than the layer ODD1 for defining the isolation is to be an isolation region of a shallow trench isolation (STI). Further, each overlap region between the layer ODD1 for defining the isolation region and the layers GAD1, GAD2, GAD3 for defining the gate electrodes is to be a gate electrode portion, and a region of the layer ODD1 for defining the isolation region except the layers GAD1, GAD2, GAD3 for defining the gate electrodes is to be a region where ion is implanted.

As described above, an electric current as a MOS transistor characteristic varies depending on the finger length. In the example shown in the drawing, the central transistor of which gate electrode is composed in the layer GAD2 for defining the gate electrode has a sufficiently long finger length LfigD2 to an isolation region end so as to be ensured to an extent that the transistor characteristic is not degraded. While, referring to the transistors located on both sides whose gate electrodes are respectively composed in the layers GAD1, GAD3 for defining gate electrodes, the finger length LfigD1 to the isolation region end is so short as to vary the transistor characteristic. Under the circumstances, it is necessary to extend the finger length from the gate electrode to the isolation region end of the transistor located on each side so that the electric current therein does not decrease.

Wherein, an electric current in a N-channel MOS transistor decreases by stress of the shallow trench isolation caused due to a short finger length. Therefore, only an N-channel MOS transistor is to be subjected to automatic extension of the finger length while the finger length of a P-channel MOS transistor is not extended.

Figure 4B:
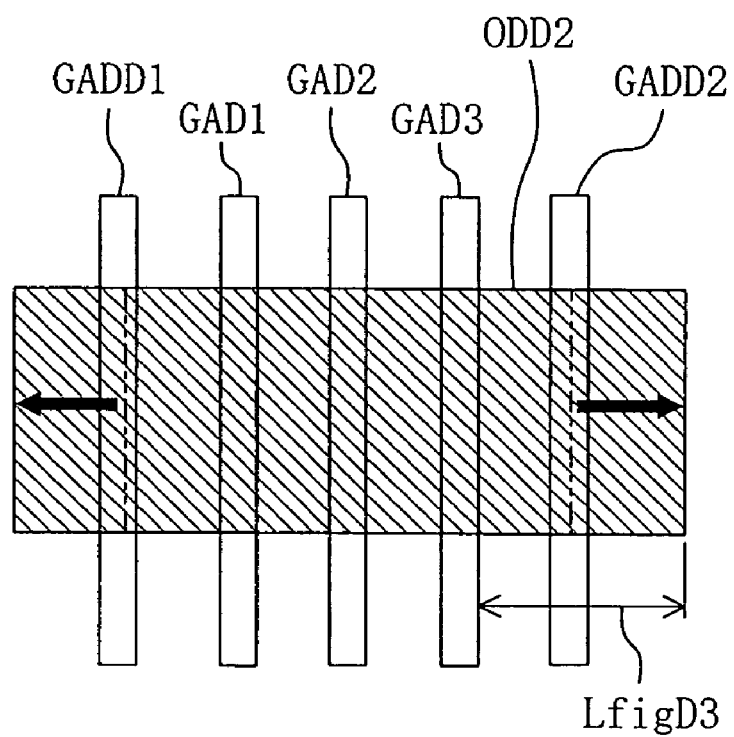

After the transistors are layouted, the layer ODD1 for defining the isolation region is extended in a direction extending the finger length LfigD1 from the gate electrode GAD3 to the end of the layer ODD1 for defining the isolation region, as shown in FIG. 4B, to set a longer finger length LfigD3.

In so doing, the source or drain diffusion region of the transistor located at each end becomes large to increase a diffusion capacity. In association therewith, operation speed may be lowered. In order to reduce the diffusion capacity, a scheme is employed in which dummy gate electrodes GADD1, GADD2 always in an OFF state are inserted and cut off by the CAD tool automatically for reducing the diffusion region. As described above, the insertion of the dummy gate electrodes GADD1, GADD2 always in the OFF state decreases the diffusion capacities of the diffusion regions connected to the respective transistors having the respective gate electrodes GAD1, GAD3.

Figure 6:
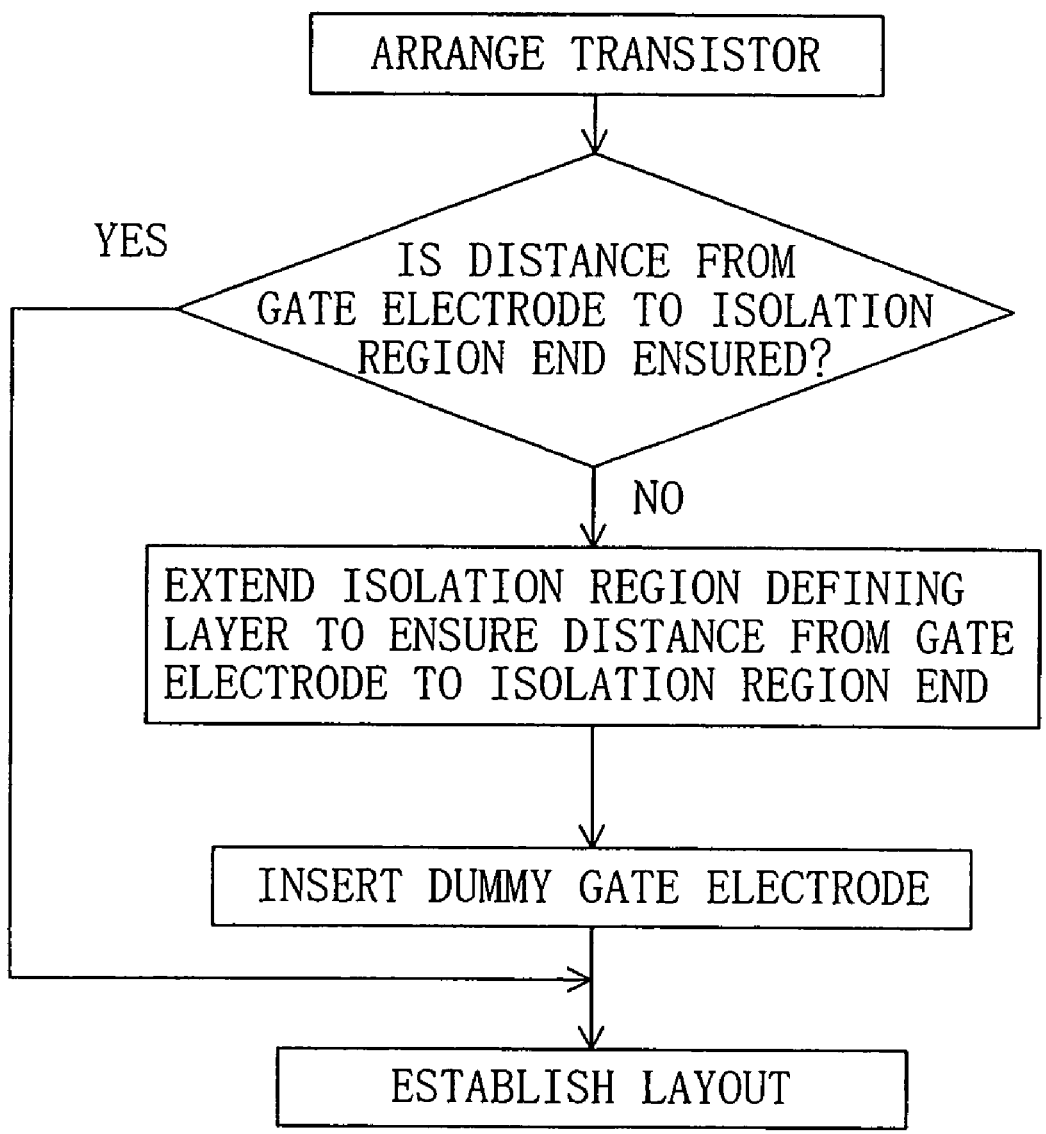
FIG. 6 is a flowchart depicting transistor layout generation in the method for computer aided design of a semiconductor integrated circuit according to Embodiment 4 of the present invention.

A flowchart is shown in FIG. 6 which depicts the aforementioned automatic insertion of the dummy gate electrodes always in the OFF state or the like.

First, in a semiconductor integrated circuit layout design system such as a layout editor, transistors are arranged. After completion of the arrangement, whether the finger length, which is a distance from a gate electrode to an isolation region end, is ensured long or not is judged. When it is ensured, the as-arranged layout is directly established as layout data.

On the other hand, when the finger length, which is the distance from the gate electrode to the isolation region end, is not ensured insufficiently, the distance from the gate electrode to the isolation region end is extended automatically to change the contour of the isolation region defining layer to that sufficiently ensuring the finger length. Subsequently, dummy gate electrodes always in an OFF state or the like are inserted automatically, and then, the arrangement is established as layout data.

It is noted that the present embodiment is described by referring a layout of the MOS transistors that use a source or a drain in common, but the same description can be applied to a layout of a single transistor.

Embodiment 5

FIG. 5 shows transistor layout generation in a method for computer aided design of a semiconductor integrated circuit in Embodiment 5 of the present invention.

Figure 5A:
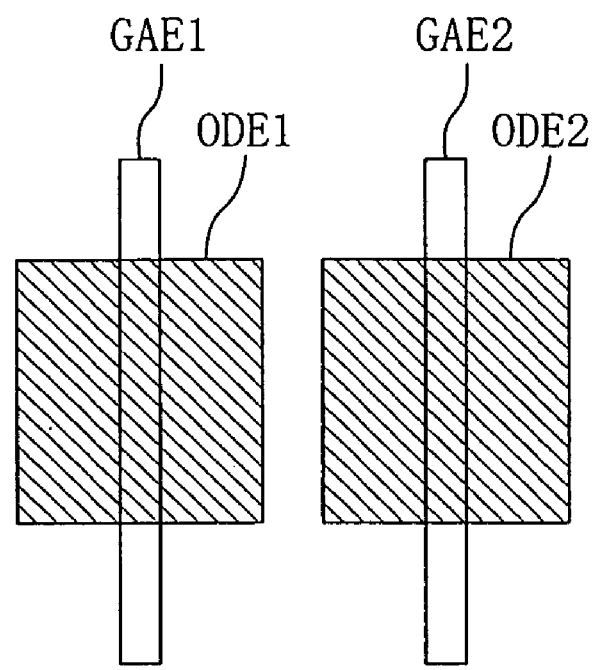
FIG. 5A is a layout diagram showing a state of an isolation region between two adjacent transistors in layout generation and FIG. 5B is a layout diagram showing a state of the isolation region extended therein.
Figure 5B:
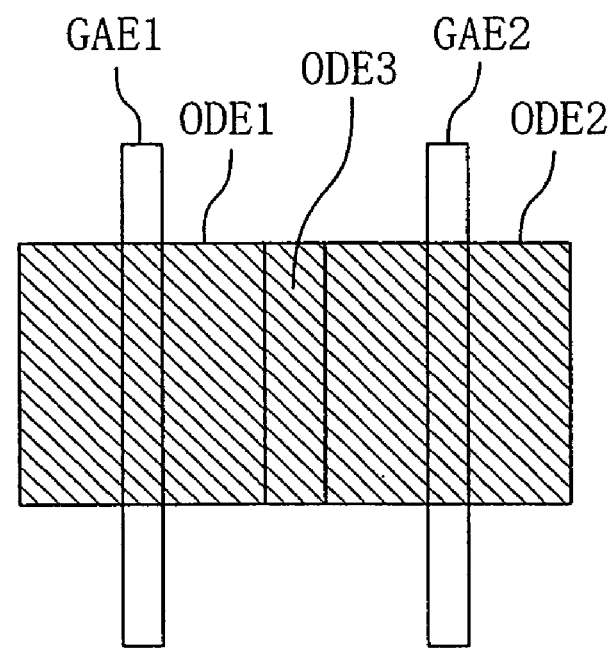

In the present embodiment, in the case where a plurality of MOS transistors are arranged adjacent to each other as shown in FIG. 5A, an isolation region defining layer ODE3 is inserted, as shown in FIG. 5B, in an isolation region located between adjacent layers ODE1, ODE2 for defining an isolation region for ensuring the finger length. Whereby, the layers for defining the isolation region are extended to remove the isolation region of adjacent two transistors, thereby ensuring the finger length.

Embodiment 6

Next, a method for computer aided design of a semiconductor integrated circuit in Embodiment 6 of the present invention will be described.

For generating layout data of a semiconductor integrated circuit, effective utilization of design property may be performed, rather than the aforementioned transistor arrangement. This is called layout migration and is a layout modification system for obtaining target layout data through automatic modification by changing a design rule of already existing original layout data, such as previous-generation design data, to a target design rule.

The aforementioned automatic generation, extension, and the like of the isolation region can be applied to the layout modification system such as the migration. In other words, the extension of an isolation region defining layer of a transistor located at the end, the insertion of a dummy gate electrode, the insertion of an isolation region defining layer to an isolation region of adjacent isolation region defining layers for ensuring the finger length can performed automatically in migration.

What is claimed is:

1. A method for computer aided design of a semiconductor integrated circuit for designing, using a CAD tool, a semiconductor integrated circuit composed by integrating a plurality of transistors and wirings on a semiconductor substrate, comprising the step of:
displaying, in layout for generating a layer for defining an isolation region between adjacent transistors among the transistors and layers for defining gate electrodes of the transistors, a plurality of layer candidates for the layer for defining the isolation region between the adjacent transistors, said candidates correspond to predetermined current decrease amounts of the transistor,
wherein the plurality of layer candidates for the layer for defining the isolation region are different from each other in distance from the gate electrode to an end of the own layer candidate.

2. The method for computer aided design of a semiconductor integrated circuit of claim 1, wherein in the step of displaying the plurality of layer candidates,
one layer for defining the isolation region between the adjacent transistors is displayed while at least one line specifying an end of the isolation region is displayed in parallel with an end of the layer for defining the isolation region, and
the end of the layer for defining the isolation region and the line are different from each other in distance from the gate electrode.

3. The method for computer aided design of a semiconductor integrated circuit of claim 1, wherein in the step of displaying the plurality of layer candidates,
one layer for defining an isolation region between an own transistor and an adjacent transistor is displayed while a plurality of colored lines are displayed in parallel with an end of the layer for defining the isolation according to a characteristic of the own transistor, and
the end of the layer for defining the isolation region and boundaries as the plurality of colored lines are different from each other in distance from the gate electrode.

4. The method for computer aided design of a semiconductor integrated circuit of claim 1, wherein in the step of displaying the plurality of layer candidates,
one layer for defining an isolation region between an own transistor and an upper or lower adjacent transistor is displayed while a line is displayed with a predetermined distance apart from an end in a direction intersected at a right angle with the gate electrode, out of upper, lower, right, and left ends of the layer for defining the isolation region, in parallel with the upper or lower end of the layer for defining the isolation according to a characteristic of the own transistor, and
the line specifies an end of an isolation region of the adjacent transistor.

5. The method for computer aided design of a semiconductor integrated circuit of claim 4, wherein in the line display, a plurality of lines different in distance from the end of the layer for defining the insulation region in the direction intersected at the right angle with the layer for defining the gate electrode are displayed according to a characteristic of the own transistor.

6. A method for computer aided design of a semiconductor integrated circuit for designing, using a CAD tool, a semiconductor integrated circuit composed by integrating a plurality of transistors and wirings on a semiconductor substrate, comprising the step of:

in layout for generating a layer for defining an isolation region between an own transistor and an adjacent transistor and a layer for defining a gate electrode of the own transistor, generating the layer for defining the isolation region between the own transistor and the adjacent transistor; and extending the generated layer for defining the isolation region according to a characteristic of the own transistor in a direction that a distance, which corresponds to predetermined current decrease amounts of the transistor, from the gate electrode to an end of the isolation region extends.

7. The method for computer aided design of a semiconductor integrated circuit of claim 6, further comprising the step of:

generating a layer for defining a dummy gate electrode on an extended portion of the generated layer for defining the isolation region which is to be a diffusion layer region.

8. The method for computer aided design of a semiconductor integrated circuit of claim 6, wherein the transistor of which layer for defining the isolation region is to be extended is an N-channel MOS transistor while a layer for defining an isolation region of a P-channel MOS transistor is not extended.

9. The method for computer aided design of a semiconductor integrated circuit of claim 6, wherein in the step of extending the generated layer for defining the isolation region, the generated layer for defining the isolation region is extended according to a characteristic of the adjacent transistor so as to remove an isolation region intervening between the own transistor and the adjacent transistor.

10. The method for computer aided design of a semiconductor integrated circuit of claim 6, wherein the step of extending the generated layer for defining the isolation region is executed at a time when original layout data is changed to target layout data by changing a design rule.

11. The method for computer aided design of a semiconductor integrated circuit of claim 10, further comprising the step of:

generating a layer for defining a dummy gate electrode on an extended portion of the generated layer for defining the isolation region which is to be a diffusion layer section.

12. The method for computer aided design of a semiconductor integrated circuit of claim 10, wherein the transistor of which layer for defining the isolation region is to be extended is an N-channel MOS transistor while a layer for defining an isolation region of a P-channel MOS transistor is not extended.

13. A method for computer aided design of a semiconductor integrated circuit for designing, using a CAD tool, a semiconductor integrated circuit composed by integrating a plurality of transistors and wirings on a semiconductor substrate, comprising the step of:

in changing original layout data to target layout data by changing a design rule, generating a layer for defining an isolation region between an own transistor and an adjacent transistor; and extending the generated layer, said extended layer corresponds to predetermined current decrease amounts of the transistor, for defining the isolation region according to a characteristic of the adjacent transistor so as to remove the isolation region intervening between the own transistor and the adjacent transistors.

* * * * *